United States Patent
Niisoe et al.

(10) Patent No.: US 7,323,758 B2
(45) Date of Patent: Jan. 29, 2008

(54) SOLID STATE IMAGING DEVICE AND METHOD FOR PRODUCING THE SAME

(75) Inventors: Naoto Niisoe, Kyoto (JP); Hiroe Ogata, Takatsuki (JP); Rieko Nishio, Kyoto (JP); Toshihiko Yano, Takaoka (JP); Hitoshi Doi, Tonami (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 11/080,418

(22) Filed: Mar. 16, 2005

(65) Prior Publication Data

US 2006/0081848 A1  Apr. 20, 2006

(30) Foreign Application Priority Data

Oct. 14, 2004 (JP) .............................. 2004-299850

(51) Int. Cl.
*H01L 31/062* (2006.01)
(52) U.S. Cl. .................. 257/435; 257/414; 257/431
(58) Field of Classification Search ................ 257/414, 257/431, 435
See application file for complete search history.

(56) References Cited

U.S. PATENT DOCUMENTS 5,068,709 A * 11/1991 Egawa et al. ................ 257/752
2005/0048708 A1 * 3/2005 Yamada et al. .............. 438/197

FOREIGN PATENT DOCUMENTS

| JP | 9-232552 | 9/1997 |
| JP | 2004-095895 | 3/2004 |

* cited by examiner

*Primary Examiner*—Long Pham
(74) *Attorney, Agent, or Firm*—McDermott Will & Emery LLP

(57) ABSTRACT

On a light shielding film 7, an anti-oxidation layer 9 covering at least the light shielding film 7 is formed. The anti-oxidation layer 9 is formed under a condition which does not oxidize a surface of the light shielding film 7. The anti-oxidation layer 9 is formed of a high melting point metal compound film having a light shielding property or an insulating film having a light transmissive property. Thus, the scattering ratio of the incident light at the surface of the light shielding film 7 can be uniform among all the pixels, and as a result, a solid state imaging device having suppressed sensitivity non-uniformity can be realized. Since the surface of the light shielding film 7 is not oxidized, the thickness of the light shielding film 7 can be reduced. Thus, the present invention can comply with the demand for size reduction of the pixels.

5 Claims, 5 Drawing Sheets

SOLID STATE IMAGING DEVICE AND METHOD FOR PRODUCING THE SAME

BACKGROUND OF THE INVENTION

1. Field of the Invention

The present invention relates to a solid state imaging device and a method for producing the same, and more specifically to a solid state imaging device including a smoothing layer on a light shielding film and a method for producing the same.

2. Description of the Background Art

In general, a solid state imaging device includes a pixel section having a plurality of pixels arranged in a matrix, and each pixel includes a light receiving section in a main surface portion of a semiconductor substrate. The light receiving section is constructed to output an electric signal in accordance with an amount of light incident thereon. A light shielding film is provided on the light receiving section for preventing light from being received by elements other than the light receiving section. The light shielding film provided on each light receiving section has an opening for guiding the light to the light receiving section. For such a light shielding film, a metal layer having a high light shielding property such as, for example, a tungsten film is used. However, a metal layer is likely to scatter the incident light at the surface thereof, and the light scattering ratio is different among the plurality of pixels due to the difference in the surface roughness. This causes a variance in the light collecting state among the light receiving sections, which tends to cause sensitivity non-uniformity in the solid state imaging device.

Under such circumstances, techniques for subjecting the surface of the light shielding film to various types of processing so as to alleviate the sensitivity non-uniformity of the solid state imaging device have been proposed. For example, Japanese Laid-Open Patent Publications Nos. 9-232552 and 2004-95895 disclose a method of oxidizing a surface of the light shielding film simultaneously with forming a smoothing layer which covers the light shielding film.

Hereinafter, a structure of a CCD (Charge Coupled Device), as an example of a solid state imaging device 400 including a light shielding film having an oxidized surface, will be described with reference to FIG. 4 and FIGS. 5A through 5E. FIG. 4 is a cross-sectional view of a pixel of the solid state imaging device 400. The solid state imaging device 400 is produced by the steps shown in FIGS. 5A through 5E.

FIGS. 5A through 5E are cross-sectional views showing the steps of production of the solid state imaging device 400 shown in FIG. 4. FIG. 5A is a cross-sectional view showing a state where a tungsten film 7a, which is to be a light shielding film 7 are formed on other elements which are formed on a semiconductor substrate 1. Such a structure is obtained as follows. First, a photodiode 2 and a charge transfer section 3 are formed in a main surface portion of the semiconductor substrate 1 by, for example, ion implantation. Next, a gate insulating film 4 is deposited on a main surface of the semiconductor substrate 1 by thermal oxidation or CVD (Chemical Vapor Deposition). When the deposition of the gate insulating film 4 is completed, a polysilicon layer is deposited by CVD and patterned into a required shape (not shown) by, for example, photolithography and dry etching, thereby forming a transfer electrode 5. Next, an inter-layer insulating film 6 formed by silicon oxide is formed by oxidation and CVD so as to cover the transfer electrode 5 and the gate insulating film 4. Then, the tungsten film 7a to be the light shielding film 7 is formed on the resultant structure by sputtering or CVD.

FIG. 5B is a cross-sectional view showing a state where a resist pattern 11 is formed in order to obtain a desired shape of the light shielding film 7. The resist pattern 11 is formed as follows. First, a surfactant is applied on the tungsten film 7a. Next, a resist is applied thereon to form a resist layer, and the resist layer is patterned by exposure and development, thereby forming an opening in the resist layer above the photodiode 2. Thus, the resist pattern 11 is formed.

FIG. 5C is a cross-sectional view showing a state where the tungsten film 7a is patterned. The tungsten film 7a is patterned by dry-etching using the resist pattern 11 as a mask. Thus, the light shielding film 7 patterned to have a desired shape is obtained. Then, the resist pattern 11 is removed.

Next, a smoothing layer 21 is formed on the light shielding film 7 by CVD. Before forming the smoothing layer 21, however, a surface of the light shielding film 7 is oxidized. FIG. 5D is a cross-sectional view showing a state where the surface of the light shielding film 7 is oxidized. The light shielding film 7 is oxidized in a chamber which is also used for CVD performed forming the smoothing layer 21. Ozone ($O_3$) gas or oxygen ($O_2$) gas is introduced into the chamber, thereby exposing the wafer to the gas atmosphere. Thus, the light shielding film 7 is gradually oxidized from the surface thereof, resulting in the formation of a tungsten oxide film 20. Since the tungsten oxide film 20 provides a low light reflectance, the scattering ratio of the incident light at the surface of the light shielding film 7 can be reduced.

FIG. 5E is a cross-sectional view showing a state where the smoothing layer 21 is formed. After the $O_3$ gas or the $O_2$ gas is expelled from the chamber, the smoothing layer 21 is formed by introducing tetraethoxysilane (TEOS) gas to the chamber. The obtained smoothing layer 21 is subjected to a smoothing treatment, so that lenses (not shown) for collecting the incident light to the light receiving section can be formed on the surface. In this manner, the solid state imaging device 400 shown in FIG. 4 is obtained.

The solid state imaging device 400 having the above-described structure has the following problems. First, the tungsten oxide film 20 easily transmits light. Due to such a property, when the tungsten oxide film 20 is formed by oxidizing the light shielding film 7 from the surface thereof, the light shielding film 7 formed of tungsten becomes thinner, which changes the effective light shielding ratio of the light shielding film 7. In order to maintain the original effective light shielding ratio of the light shielding film 7, it is necessary to form the tungsten film 7a to be thicker than actually necessary in consideration of the reduction in the thickness by the formation of the tungsten oxide film 20. However, it is actually difficult to expect how much the thickness of the light shielding film 7 will be reduced, and in addition, an increase in the thickness of the light shielding film 7 prevents size reduction of pixels.

Second, when the surface of the light shielding film 7 was oxidized at a temperature of about 500° C. as described in Japanese Laid-Open Patent Publication No. 2004-95895 in a CVD chamber as described above, it was found to be difficult to form the tungsten oxide film 20 with a uniform thickness. This is considered to be due to the oxidation temperature of the light shielding film 7 formed of tungsten. In general, a tungsten film is easy to be oxidized, and so is oxidized to a very small degree even at room temperature. It is considered that a tungsten film starts to be oxidized at about 400° C. and the oxidation rapidly proceeds at about 700° C. The reason why the thickness of the tungsten oxide film 20 is non-uniform is considered to be that an oxide film is not sufficiently formed at a temperature of about 500° C.

In the case where the tungsten oxide film 20 having a non-uniform thickness is formed on the surface of the light shielding film 7, the light reflectance is lower in an area where the tungsten oxide film 20 is thicker and is higher in an area where the tungsten oxide film 20 is thinner. In the case where the light shielding film 7 formed of tungsten has areas having tungsten oxide formed thereon and areas having no tungsten oxide formed thereon as a result of non-uniform oxidization, the levels of these two different areas are different; i.e., the surface of the light shielding film 7 has convexed areas and concaved areas. As a result, the light scattering ratio is different between these two different areas (i.e., between the surface of the light shielding film 7 and the surface of the tungsten oxide).

Therefore, the solid state imaging device 400 has a variance in the light collecting state, i.e., sensitivity non-uniformity due to the non-uniform reflectance in the vicinity of the opening 8, in each light receiving section. Even if each light receiving section has a variance in the light collecting state, as long as the variance is uniform among the plurality of pixels, the sensitivity non-uniformity is small in the entire pixel section and causes little problem. However, in the solid state imaging device 400 having the above-described structure, the scattering ratio at the surface of the light shielding film 7 is different among the plurality of pixels, and therefore the sensitivity non-uniformity is large in the entire pixel section. It is conceivable to oxidize the light shielding film 7 at a temperature as high as 700° C. in order to obtain the tungsten oxide film 20 having a uniform thickness. However, such a treatment causes deterioration in the light receiving section or the like and is not preferable.

SUMMARY OF THE INVENTION

Therefore, an object of the present invention is to provide a solid state imaging device capable of suppressing sensitivity non-uniformity owing to the uniform reflectance of the incident light at the surface of the light shielding film and also capable of realizing size reduction of pixels by reducing the thickness of the light shielding film, and a method for producing the same.

The present invention has the following features to attain the object mentioned above.

A first aspect of the present invention is directed to a solid state imaging device for outputting an electric signal in accordance with an amount of light incident on a light receiving section thereof. The solid state imaging device comprises the light receiving section formed in a main surface portion of a semiconductor substrate; a light shielding film having an opening above the light receiving section; an anti-oxidation layer covering at least the light shielding film and preventing a surface of the light shielding film from being oxidized; and a smoothing layer covering an entire surface of a semiconductor substrate body including the anti-oxidation layer. In this specification, a semiconductor substrate as a base for forming the solid state imaging device and the various elements formed on the semiconductor substrate will be collectively referred to as a "semiconductor substrate body" for the sake of convenience. Owing to the above structure, the solid state imaging device according to the present invention can make the scattering ratio of light at the surface of the light shielding film more uniform by the anti-oxidation layer. Since the surface of the light shielding film is prevented from being oxidized, the problem of a difference in the effective thickness of the light shielding film among the plurality of pixels is solved, which can suppress the sensitivity non-uniformity. Since the light shielding film is covered with the anti-oxidation layer while the surface of the light shielding film is not oxidized, the thickness of the light shielding film can be maintained at the originally intended thickness. This eliminates the necessity of forming the light shielding film to be thicker than actually necessary in consideration of the reduction in the thickness. This can reduce the thickness of the light shielding film and thus reduce the size of the pixels.

As the anti-oxidation layer, which is one feature of the solid state imaging device of the present invention, a high melting point metal compound film having a light shielding property is usable. For example, when the light shielding film is a tungsten film, one type of film selected from the group consisting of a tungsten silicide film, a tungsten nitride film, and a titanium nitride film is preferably usable as the anti-oxidation film. Since such a high melting point metal compound film having a light shielding property is formed with a uniform thickness, the scattering ratio of the incident light can be made more uniform.

Especially when the light shielding film is a tungsten film and a tungsten silicide film is formed as the anti-oxidation layer, the problem of dark current can be alleviated in addition to the above-described effects, for the following reason. When producing a solid state imaging device, hydrogen sintering is performed for terminating the interface level of the silicon substrate in a step after the formation of the light shielding film. In the case of a conventional solid state imaging device, hydrogen is occluded by the tungsten film and a sufficient amount of hydrogen does not reach the silicon substrate because tungsten has a property of occluding hydrogen. By contrast, according to the present invention, hydrogen can be prevented from being occluded because the tungsten silicide film formed on the surface of the tungsten film acts as a cover film. Since a sufficient amount of hydrogen reaches the silicon substrate, the interface level is terminated. This can reduce the amount of the dark current.

The anti-oxidation layer may be formed of an insulating film having a light transmissive property. For example, when the light shielding film is a tungsten film, a silicon nitride film or a silicon nitride-oxide film is preferably usable as the anti-oxidation layer. Such an insulating film having a light transmissive property provides a lower light reflectance than that of a metal film and has a uniform thickness. Therefore, the scattering ratio of the incident light can be made more uniform.

The anti-oxidation layer preferably has a thickness in the range between equal to or greater than 10 nm and equal to or less than 100 nm. With such a thickness, the anti-oxidation layer can completely cover the surface of the light shielding film.

The present invention is also directed to a method for producing a solid state imaging device for outputting an electric signal in accordance with an amount of light incident on a light receiving section thereof. According to this method, the light receiving section is first formed in a main surface portion of a semiconductor substrate. Next, a light shielding film having an opening above the light receiving section is formed. Then, an anti-oxidation layer covering at least the light shielding film is formed under a condition which does not oxidize a surface of the light shielding film. Next, a smoothing layer covering an entire surface of the semiconductor substrate body including the anti-oxidation layer is formed.

By covering the surface of the light shielding film with the anti-oxidation layer, the anti-oxidation layer can be formed with a uniform thickness. Since this reduces the non-uniformity in the reflectance of the incident light, a solid state imaging device in which the variance in the light collecting state at the light receiving section is restricted and thus the sensitivity non-uniformity is suppressed can be obtained. Since the light shielding film is covered with the anti-oxidation layer while the surface of the light shielding film is not oxidized, the thickness of the light shielding film can be maintained at the originally intended thickness. This eliminates the necessity of forming the light shielding film to be thicker than actually necessary in consideration of the reduction in the thickness. This can reduce the thickness of the light shielding film and thus reduce the size of the pixels.

According to the present invention, the step of forming the anti-oxidation layer is performed in at least one of: a condition of an atmosphere of a reactive gas which does not oxidize the surface of the light shielding film, and a condition of an atmosphere of a temperature lower than a temperature at which the surface of the light shielding film is oxidized, in order to prevent the oxidation of the surface of the light shielding film. In the step of forming the anti-oxidation layer, silane gas is preferably usable as a reactive gas. The step of forming the anti-oxidation layer can be performed by sputtering or chemical vapor deposition.

The step of forming the anti-oxidation layer and the step of forming the smoothing layer may be performed in one procedure by a series of chemical vapor deposition processes; and in the procedure of forming the anti-oxidation layer and the smoothing layer, silane gas and nitrous oxide gas may be used as a reactive gas.

The step of forming the light shielding film includes the step of depositing a metal film having a light shielding property on a main surface of the semiconductor substrate, and the step of patterning the metal film into a desired shape. In the step of forming the anti-oxidation layer, a thin film for forming the anti-oxidation layer may be deposited directly on the metal film, and the metal film and the thin film may be simultaneously patterned in the step of patterning the metal film. Alternatively, in the step of forming the anti-oxidation layer, a thin film for forming the anti-oxidation layer may be deposited so as to cover the entire surface of the semiconductor substrate body including the light shielding film obtained as a result of the step of patterning.

As described above, according to the present invention, a solid state imaging device can be provided, in which by covering at least the light shielding film with the anti-oxidation layer, the surface of the light shielding film is not prevented from being oxidized, the reflectance of the incident light at the surface of the light shielding film can be made more uniform, and the variance in the light collecting state at the light receiving section is restricted and thus the sensitivity non-uniformity is suppressed. In addition, since the thickness of the light shielding film can be reduced, the present invention can comply with the demand for size reduction of the pixels.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
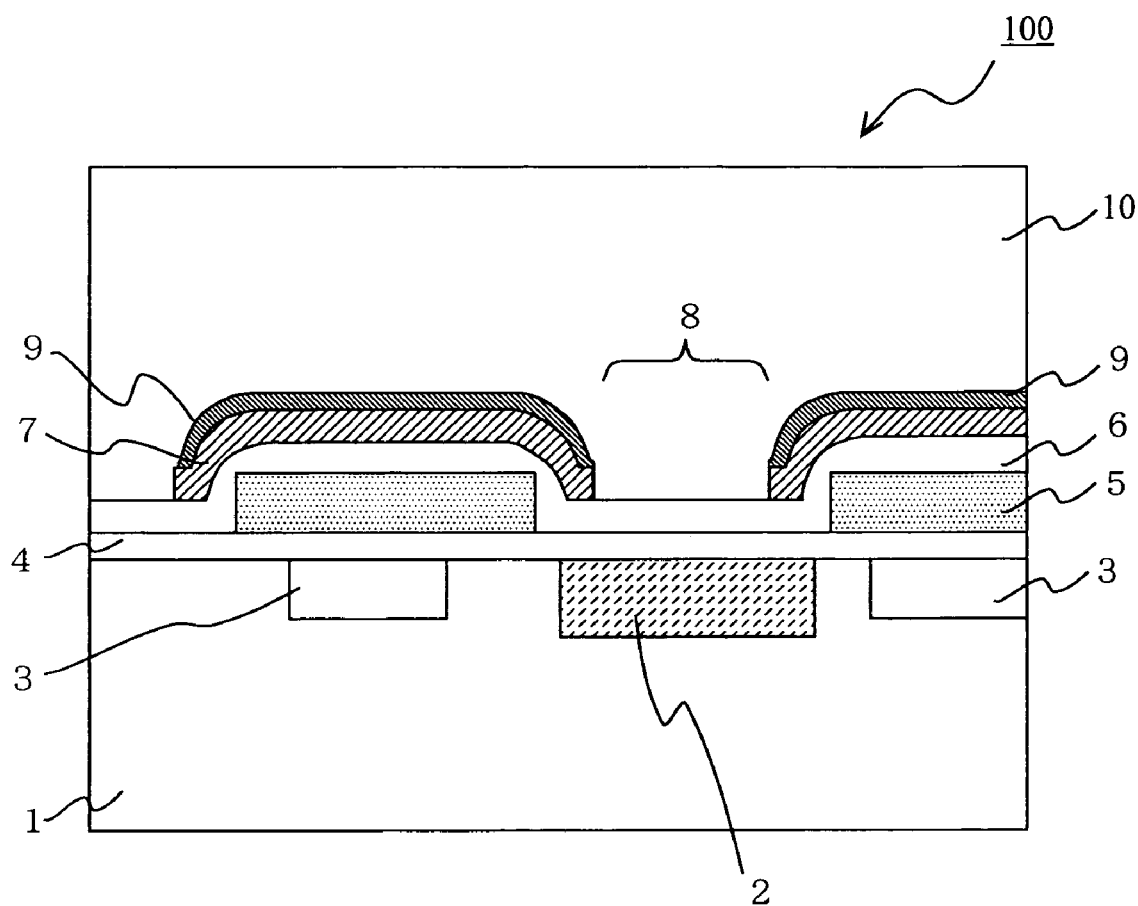
FIG. 1 is a cross-sectional view showing a structure of a solid state imaging device according to Embodiment 1 of the present invention.

Hereinafter, a CCD will be described in detail as an example of a solid state imaging device 100 according to Embodiment 1 of the present invention. The solid state imaging device 100 includes a pixel section having a plurality of pixels arranged in a matrix and a peripheral circuit section provided around the pixel section. FIG. 1 is a cross-sectional view showing a structure of a pixel included in the pixel section of the solid state imaging device 100 according to this embodiment. In FIG. 1, the pixel of the solid state imaging device 100 includes a semiconductor substrate 1, a photodiode 2, a charge transfer section 3, a gate insulating film 4, a transfer electrode 5, an inter-layer insulating film 6, a light shielding film 7, an anti-oxidation layer 9, and a smoothing layer 10.

The semiconductor substrate 1 is a silicon substrate used as a base for forming the solid state imaging device 100, and is formed of, for example, a P type semiconductor layer. The photodiode 2 as a light receiving section is a diffusion layer formed by introducing an impurity having an opposite conductivity type to that of the semiconductor substrate 1 (e.g., an N type impurity) into a main surface portion of the semiconductor substrate land thermally diffusing the introduced impurity. The photodiode 2 generates a signal charge having an electric charge amount in accordance with the intensity of the received light and accumulates generated signal charges therein. The photodiode 2 may be alternatively formed by introducing a P type impurity into an N type semiconductor substrate to form a P type layer and introducing an N type impurity into the P type layer.

The charge transfer section 3 is formed adjacent to the photodiode 2 in the main surface portion of the semiconductor substrate 1, and transfers the charges generated in the photodiode 2. The gate insulating film 4 is formed so as to cover the main surface portion of the semiconductor substrate 1 and insulates the semiconductor substrate 1 and the transfer electrode 5 from each other. The transfer electrode 5 is formed above the semiconductor substrate 1 with the gate insulating film 4 interposed therebetween. When seen from the above, the transfer electrode 5 is provided adjacent to the photodiode 2. When a pulse voltage is applied, the transfer electrode 5 transfers the charges generated in the photodiode 2 along the charge transfer section 3. The inter-layer insulating film 6 is formed so as to cover the gate insulating film 4 and the transfer electrode 5 and thus insulates the transfer electrode 5 and the light shielding film 7 from each other.

The light shielding film 7 is formed so as to cover the entirety of the transfer electrode 5 in order to prevent the transfer electrode 5 from being exposed to light, and has an opening 8 above the photodiode 2 so as to allow the photodiode 2 to receive light. The light shielding film 7 is formed of a metal film having a light shielding property, and preferably of a metal film which can be formed by sputtering or CVD. Any metal film having a light shielding property is usable for the light shielding film 7 with no specific limitation. Usable metal films include, for example, high melting point metal films, high melting point metal compound films, and films formed by laminating these films. Such metal films partially including a low melting point metal film formed of aluminum or an alloy thereof are also usable. Specifically, usable metal films include, for example, tungsten films, titanium films, molybdenum films, tantalum films, platinum films, copper films, tungsten-titanium alloy films, tungsten silicide films, molybdenum silicide films, and titanium nitride films. Especially, the tungsten films are preferable owing to a high light shielding property thereof. As the tungsten films, a tungsten sputtered film formed by sputtering or a tungsten CVD film formed by CVD, or the like is usable. These films may be used independently or in a laminated state.

The anti-oxidation layer 9 is formed so as to cover the light shielding film 7. The smoothing layer 10 is formed on the anti-oxidation layer 9 and has a surface treated to be smoothed. In more detail, the smoothing layer 10 is formed on the entire surface of the various elements formed on the semiconductor substrate 1. In this specification, the semiconductor substrate 1 and the various elements formed on the semiconductor substrate 1 will be collectively referred to as a "semiconductor substrate body" for the sake of convenience. As the material for the smoothing layer 10, conventionally known silicon oxide is preferably used with no specific limitation. On the smoothing layer 10, a color filter for transmitting light of a specific wavelength (red, green, blue, etc.) and various lenses such as, for example, plano-convex lenses projecting upward or on-chip microlenses are formed although not shown here. The incident light is collected in the vicinity of a surface of the photodiode 2 by these lenses.

Hereinafter, the anti-oxidation layer 9 as one feature of this embodiment will be described in detail. The anti-oxidation layer 9 which is in direct contact with the light shielding film 7 is formed of a high melting point metal compound having a light shielding property, and is formed under the conditions that do not oxidize a surface of the light shielding film 7. Specifically, the anti-oxidation layer 9 is formed under at least one of the conditions: (i) in a reactive gas atmosphere which does not oxidize the surface of the light shielding film 7 and (ii) in an atmosphere of a temperature which is lower than the temperature at which the surface of the light shielding film 7 is oxidized. A high melting point metal compound having a light shielding property is formed under such a condition, either by a method of exposing the light shielding film 7 to a reactive gas atmosphere, CVD, or sputtering. Any reactive gas which does not oxidize the surface of the light shielding film 7 is usable. In the case where the light shielding film 7 is a tungsten film, silane ($SiH_4$) gas, nitrogen ($N_2$) gas, or the like is preferably usable. By use of such a reactive gas, a high melting point metal compound film having a light shielding property such as a tungsten silicide film, a tungsten nitride film or a titanium nitride film is formed on the surface of the light shielding film 7.

By intentionally covering the surface of the light shielding film 7 with the anti-oxidation layer 9 formed of a high melting point metal compound, the surface of the light shielding film 7 can be prevented from being non-uniformly oxidized, and also the smoothness of the surface of the light shielding film 7 can be improved. In the case where the anti-oxidation layer 9 is formed by CVD or sputtering, the thickness of the light shielding film 7 is more uniform than the light shielding film 7 of the conventional solid state imaging device 400, which has an oxidized surface. For these reasons, the surface light reflectance of the light shielding film 7 covered with the anti-oxidation layer 9 is more uniform than that of the light shielding film 7 having no anti-oxidation layer 9 formed thereon or the light shielding film 7 having an oxidized surface. In addition, since the scattering ratio is uniform among the plurality of pixels, the sensitivity non-uniformity which is caused by the scattering of the light can be reduced in the entire pixel section. Thus, the variance in the light collecting state of the light receiving section caused by the non-uniform light reflectance of the light shielding film 7 is suppressed, and thus the solid state imaging device 100 having less sensitivity non-uniformity is obtained.

In the production of the solid state imaging device 100, hydrogen sintering for terminating the interface level of the silicon substrate is performed in a step after the light shielding film 7 is formed. In the case of the conventional solid state imaging device 400 including a light shielding film formed of tungsten, hydrogen is occluded by the tungsten film and does not reach the silicon substrate because tungsten has a property of occluding hydrogen. By contrast, in the solid state imaging device 100 according to this embodiment, hydrogen can be prevented from being occluded because the anti-oxidation layer 9, which is formed of a tungsten silicide film on the surface of the light shielding film 7 formed of tungsten, acts as a cover film. Since a sufficient amount of hydrogen reaches the silicon substrate, the interface level is terminated. This offers an effect of reducing the amount of a dark current.

In this embodiment, the "atmosphere of a temperature which is lower than the temperature at which the surface of the light shielding film 7 is oxidized" can be realized by setting the substrate temperature when the anti-oxidation layer 9 is formed to a temperature at which the surface of the light shielding film 7 is not oxidized. For example, in the case where the light shielding film 7 is a tungsten film and a tungsten silicide film is used as the anti-oxidation layer 9, the tungsten silicide film is formed in an atmosphere obtained by setting the substrate temperature to 450° C. or lower. With such a substrate temperature, the surface of the light shielding film 7 formed of tungsten is not oxidized. Therefore, the thickness of the light shielding film 7 can be maintained at the originally intended thickness, which eliminates the necessity of forming the light shielding film 7 to be thicker than actually necessary in consideration of the reduction in the thickness, unlike in conventional solid state imaging device 400. This can reduce the thickness of the light shielding film 7 and thus reduce the size of the pixels.

In the solid state imaging device 100 having the above-described structure, the thickness of the anti-oxidation layer 9 is preferably in the range between equal to or greater than 10 nm and equal to or less than 100 nm. When the thickness of the anti-oxidation layer 9 is less than 10 nm, it is difficult for the anti-oxidation layer 9 to uniformly cover the light shielding film 7. The thickness of the anti-oxidation layer 9 may exceed 100 nm, but when the anti-oxidation layer 9 is too thick, the formation thereof is time-consuming and the production efficiency is lowered.

A method for producing the solid state imaging device 100 according to this embodiment will be specifically described. FIGS. 2A through 2E are cross-sectional views of the semiconductor substrate 1 and elements formed thereon in the steps of production of the solid state imaging device 100 shown in FIG. 1.

Figure 2A:
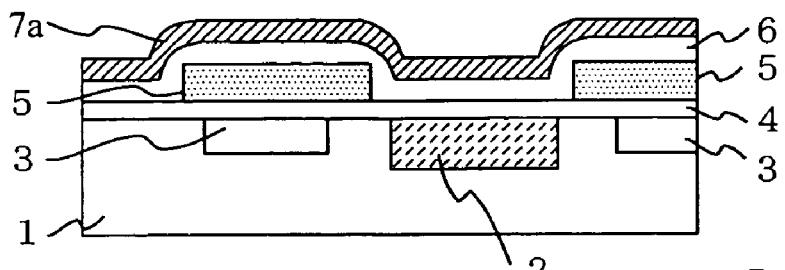
FIGS. 2A through 2E are cross-sectional views showing the steps of production of the solid state imaging device shown in FIG. 1.

FIG. 2A is a cross-sectional view showing elements formed on the main surface of the semiconductor substrate 1 for forming the light shielding film 7. Such a structure is obtained as follows. First, the photodiode 2 and the charge transfer section 3 are formed in the main surface portion of the semiconductor substrate 1 by ion implantation or the like. Next, a silicon oxide ($SiO_2$) film is deposited to a thickness of 15 nm to 70 nm on a main surface of the semiconductor substrate 1 by thermal oxidation or CVD, thereby forming the gate insulating film 4. The gate insulating film 4 may have an ONO ($SiO_2$—SiN—$SiO_2$) film structure. Specifically, such an ONO film structure is, for example, a lamination structure in which the lower $SiO_2$ film has a thickness of 15 nm to 40 nm, the SiN film has a thickness of 15 nm to 50 nm, and the upper $SiO_2$ film has a thickness of 5 nm to 10 nm.

Next, a polysilicon film is deposited to a thickness of 150 nm to 400 nm on the gate insulating film 4 by CVD. The polysilicon film is treated with, for example, photolithography and dry etching to be patterned into a required shape (not shown), thereby forming the transfer electrode 5. Then, the inter-layer insulating film 6 of silicon oxide is deposited by thermal oxidation and CVD. Thus, the transfer electrode 5 and the gate insulating film 4 are covered with the inter-layer insulating film 6.

On the resultant structure, the tungsten film 7a is formed. Specifically, the reducible inner pressure of a chamber of a CVD apparatus is controlled to be 10 Torr, and the substrate temperature is set to 450° C. In such a chamber, the tungsten film 7a is deposited to a thickness of 150 nm to 250 nm by CVD. The tungsten film 7a may be alternatively formed by sputtering.

Figure 2B:
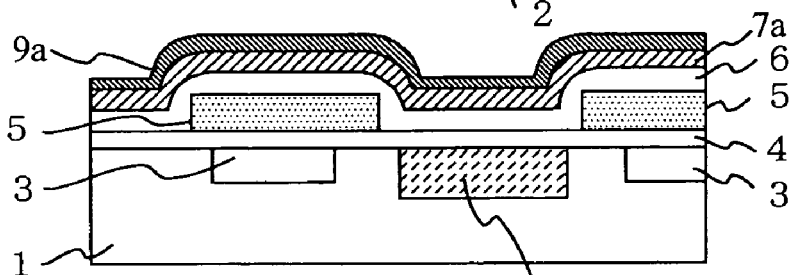

FIG. 2B is a cross-sectional view showing a state where a tungsten silicide film 9a for forming the anti-oxidation layer 9 is deposited on the tungsten film 7a. In the case where the tungsten silicide film 9a is formed by a method of leaving the tungsten film 7a in a reactive gas atmosphere, the tungsten silicide film 9a is specifically formed as follows. A chamber which is set to have a temperature of 450° C. and a pressure of 30 Torr is supplied with $SiH_4$ gas as a reactive gas at 30 sccm. The tungsten film 7a is exposed to this atmosphere for about 45 seconds. Thus, the tungsten silicide film 9a having a thickness of 10 nm is formed. With such a chamber temperature, the substrate temperature is about 410° C., and thus the surface of the tungsten film 7a is not oxidized.

In the case where CVD is used, the tungsten silicide film 9a is specifically formed as follows. A chamber which is set to have a temperature of 550° C. and a pressure of 800 mTorr is supplied with $SiH_4$ gas at 800 sccm and tungsten hexafluoride ($WF_6$) gas at 5 sccm, both as a reactive gas. The tungsten film 7a is exposed to this atmosphere for about 5 seconds. Thus, the tungsten silicide film 9a having a thickness of 10 nm is formed. Since neither reactive gas used for this treatment contains $O_2$ gas or $O_3$ gas, the surface of the tungsten film 7a is not oxidized.

In the case where sputtering is used, the tungsten silicide film 9a is specifically formed as follows. Tungsten silicide is used as a target. Sputtering is performed at a target temperature of 100° C. Thus, the tungsten silicide film 9a having a thickness of 10 nm is formed.

Figure 2C:
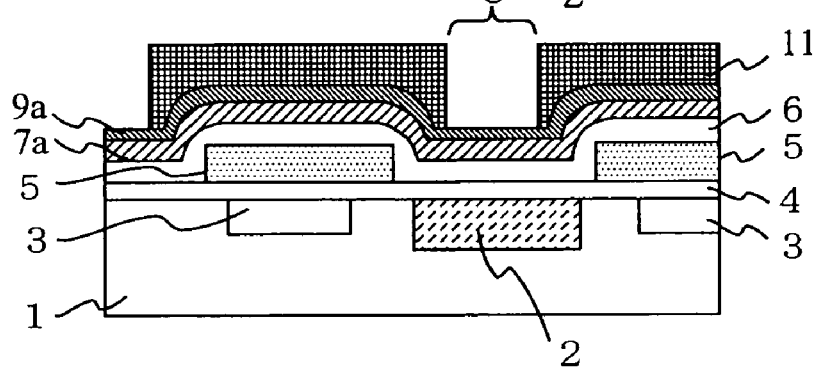

FIG. 2C is a cross-sectional view showing a state where a resist pattern 11 is formed on the tungsten silicide film 9a which is formed by one of the above-described methods.

The resist pattern 11 is formed as follows. First, a surfactant such hexamethyldisilazane (HMDS) or the like is applied on the tungsten silicide film 9a. Next, a resist is applied to form a resist film, and the resist film is subjected to exposure and development, thereby forming the resist pattern 11 having the opening 8 above the photodiode 2.

Figure 2D:
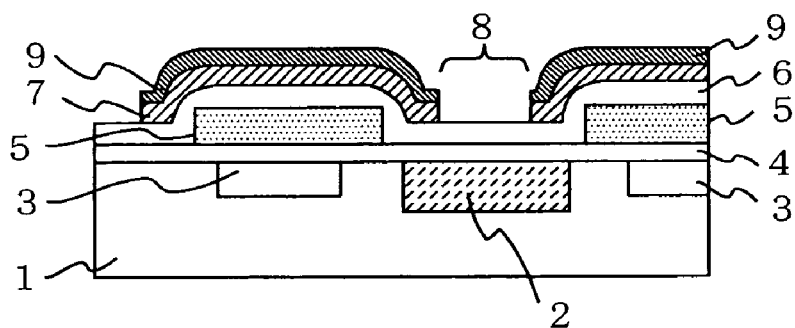

FIG. 2D is a cross-sectional view showing a state where the tungsten film 7a and the tungsten silicide film 9a are patterned so as to form the light shielding film 7 and the anti-oxidation layer 9. The light shielding film 7 and the anti-oxidation layer 9 having such a shape are obtained as follows. First, using the resist pattern 11 as a mask, the tungsten film 7a and the tungsten silicide film 9a are dry-etched by a plasma etching apparatus. Thus, the light shielding film 7 and the anti-oxidation layer 9 having the opening 8 above the light receiving section (photodiode 2) are obtained in the state where the anti-oxidation layer 9 covers the light shielding film 7. The resist pattern 11 is removed by ashing which is performed using a plasma ashing apparatus. Herein, "ashing" means completely removing the resist pattern 11. If permitted by the treatment conditions, for example, after the resist pattern 11 is ashed, the resultant structure may be treated with wet cleaning in order to clean the surface thereof.

Figure 2E:
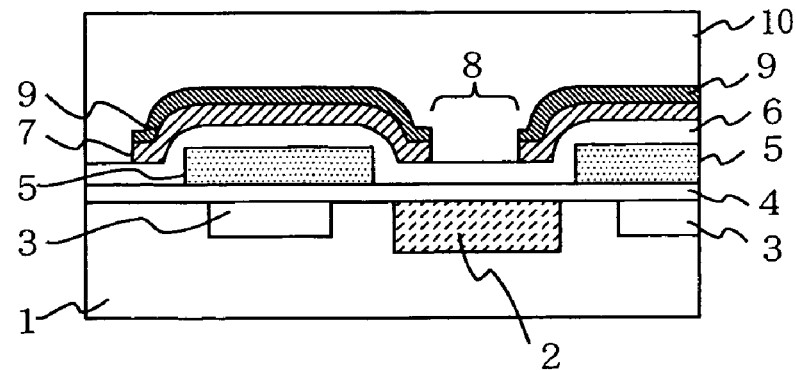

FIG. 2E is a cross-sectional view showing a state where the smoothing layer 10 is formed on the anti-oxidation layer 9. The smoothing layer 10 is formed by CVD using TEOS gas as a reactive gas. The chamber temperature is set to be, for example, 480° C. which is higher than the temperature at which the anti-oxidation layer 9 is formed. In such a chamber, a silicon oxide film having a thickness of 100 nm to 800 nm is formed as the smoothing layer 10. A surface of the obtained smoothing layer 10 is subjected to surface smoothing such as reflow or CMP (Chemical Mechanical Polishing) in order to prepare the surface for the provision of lenses such as light collection lenses or microlenses and a color filter.

In the solid state imaging device 100 produced as described above, the surface of the light shielding film 7 is not oxidized and also is covered with the anti-oxidation layer 9 having a uniform thickness. Therefore, the reflectance of the incident light can be uniform among the plurality of pixels, and thus the sensitivity non-uniformity of the solid state imaging device 100 can be suppressed. Since the surface of the tungsten film forming the light shielding film 7 is covered with the tungsten silicide film forming the anti-oxidation layer 9, occlusion of hydrogen can be prevented by the tungsten silicide film in hydrogen sintering which is performed in a step after the formation of the light shielding film 7 as described above. In a consequence, a sufficient amount of hydrogen reaches the silicon substrate and terminates the interface level. This reduces the amount of a dark current. An actual examination of the solid state imaging device 100 according to this embodiment confirmed that the amount of the dark current is reduced by 30% as compared with a solid state imaging device which does not include the anti-oxidation layer 9 and that the problem of the generation of the dark current is thus alleviated.

In the above description, the anti-oxidation layer 9 is formed of the tungsten silicide film 9a as shown in FIG. 2B. Alternatively, the anti-oxidation layer 9 may be formed of a tungsten nitride film. The tungsten nitride film is formed as follows. When the method of exposing the tungsten film 7a to a reactive gas atmosphere is used, $N_2$ gas is used as a reactive gas. When sputtering is used, a tungsten target is used in an $N_2$ gas atmosphere. In the case where the anti-oxidation layer 9 is formed of a titanium nitride film, a titanium nitride target can be used.

Embodiment 2

In this embodiment, a solid state imaging device using an insulating film having a light transmissive property as the anti-oxidation layer 9, and a method for producing the same, will be described. The method for producing the solid state imaging device according to this embodiment is the same as the method described in Embodiment 1 except for the formation of the anti-oxidation layer 9, and only the step of forming the anti-oxidation layer 9 will be described below.

In this embodiment, the "insulating film having a light transmissive property which forms the anti-oxidation layer 9" is an insulating film formed in a reactive gas atmosphere which does not oxidize the surface of the light shielding film 7. The anti-oxidation layer 9 formed of such an insulating film transmits the incident light, and therefore does not completely solve the scattering of the incident light at the surface of the light shielding film 7 even when the anti-oxidation layer 9 covers the surface of the light shielding film 7. However, the light reflectance of the anti-oxidation layer 9 formed of the insulating film is lower than that of a metal film, and the anti-oxidation layer 9 has a uniform thickness. Therefore, the scattering ratio of the incident light can be made more uniform. Thus, the solid state imaging device according to this embodiment has a uniform scattering ratio among the plurality of pixels and can reduce the sensitivity non-uniformity of the entire pixel section caused by the scattering of the light.

As the insulating material of the anti-oxidation layer 9, a silicon nitride film or a silicon nitride-oxide film is preferably usable when the light shielding film 7 is formed of a tungsten film. A silicon nitride film or a silicon nitride-oxide film can be formed by using CVD in the step of FIG. 2B described in Embodiment 1.

Specifically, in the step shown in FIG. 2B, a silicon nitride film is deposited instead of the tungsten silicide film 9a. CVD is performed as follows. A chamber which is set to have a temperature of 400° C. and a pressure of 2.6 Torr is supplied with $SiH_4$ gas at 0.5 slm, ammonia ($NH_3$) gas at 3.8 slm, and $N_2$ gas at 1.6 slm, all as a reactive gas. The tungsten film 7a is exposed to such a reactive gas atmosphere for about 0.7 seconds. Thus, the tungsten nitride film having a thickness of 10 nm is formed. Since no reactive gas used here contains $O_2$ gas or $O_3$ gas, the surface of the tungsten nitride film 7a is not oxidized.

A silicon nitride-oxide film as the anti-oxidation layer 9 is formed by CVD as follows. A chamber which is set to have a temperature of 400° C. and a pressure of 1.6 Torr is supplied with $SiH_4$ gas at 0.5 slm, nitrous oxide ($N_2O$) gas at 3.8 slm, and nitrogen gas at 3.0 slm, all as a reactive gas. The tungsten film 7a is exposed to such a reactive gas atmosphere for about 0.3 seconds. Thus, the tungsten nitride-oxide film having a thickness of 10 nm is formed.

Embodiment 3

In this embodiment, a solid state imaging device including the anti-oxidation layer 9 covering an entire surface of a semiconductor substrate body including the light shielding film 7, and a method for producing the same, will be described. In this embodiment, the anti-oxidation layer 9 and the smoothing layer 10 are formed in the same equipment (chamber) by CVD. Hereinafter, a method for producing the solid state imaging device according to this embodiment will be specifically described with reference to FIGS. 3A through 3E. FIGS. 3A through 3E are cross-sectional views showing the steps of production of the solid state imaging device according to this embodiment.

Figure 3A:
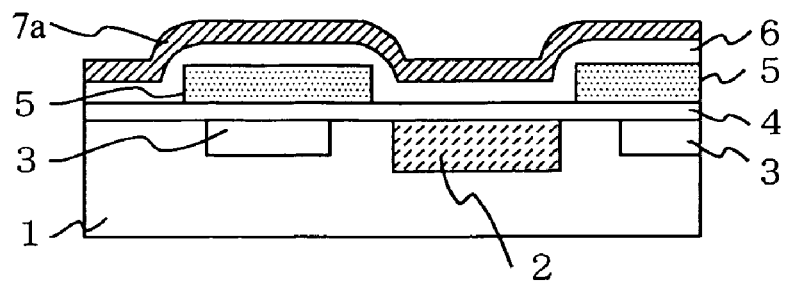
FIGS. 3A through 3E are cross-sectional views showing the steps of production of a solid state imaging device according to Embodiment 3 of the present invention.
Figure 3B:
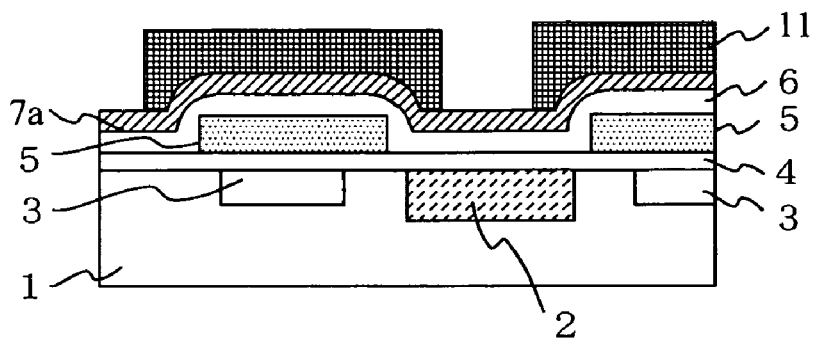
Figure 3C:
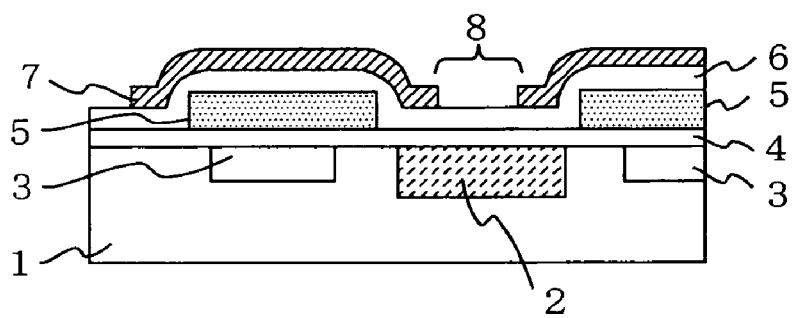

FIG. 3A shows a state where elements are formed on the main surface of the semiconductor substrate 1 for forming the light shielding film 7, like FIG. 2A. FIG. 3B shows a state where the resist pattern 11 is formed on the tungsten sputtered film 7a of the structure shown in FIG. 3A. The resist pattern 11 is formed by the method described above with reference to FIG. 2C. FIG. 3C is a cross-sectional view showing a state where the light shielding film 7 is formed as a result of patterning the tungsten sputtered film 7a. The light shielding film 7 having such a shape is obtained by the method described above with reference to FIG. 2D. The light shielding film 7 may be formed by CVD instead of sputtering.

Figure 3D:
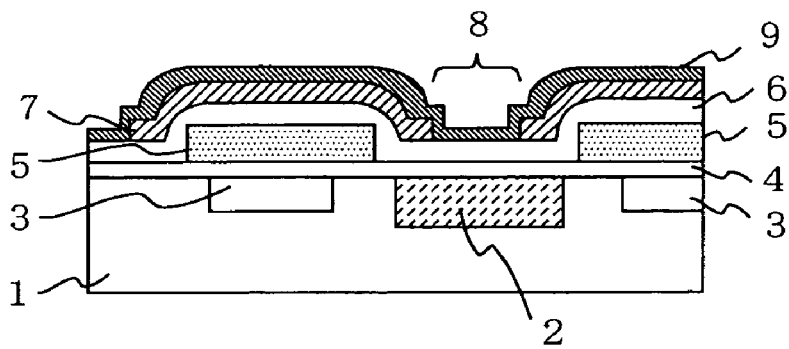

FIG. 3D is a cross-sectional view showing a state where the anti-oxidation layer 9 covers an entire surface of the semiconductor substrate body including the surface of the light shielding film 7. The anti-oxidation layer 9 in such a state is formed by CVD, which is performed as follows. A chamber which is set to have a temperature of 400° C. and a pressure of 3.0 Torr is supplied with $SiH_4$ gas at 62 sccm and nitrous oxide gas at 130 sccm, both as a reactive gas. Thus, an $SiH_4$-based gas is first attached to the entire surface of the semiconductor substrate body including the surface of the light shielding film 7. Thus, a silicide film having a thickness of about 10 nm is formed as the anti-oxidation layer 9.

Figure 3E:
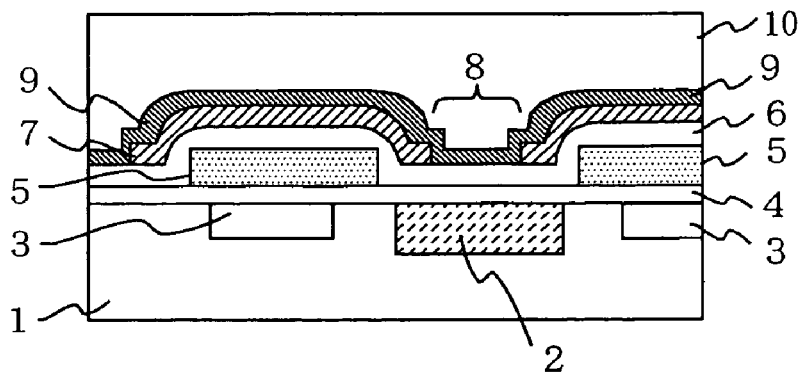
Figure 4:
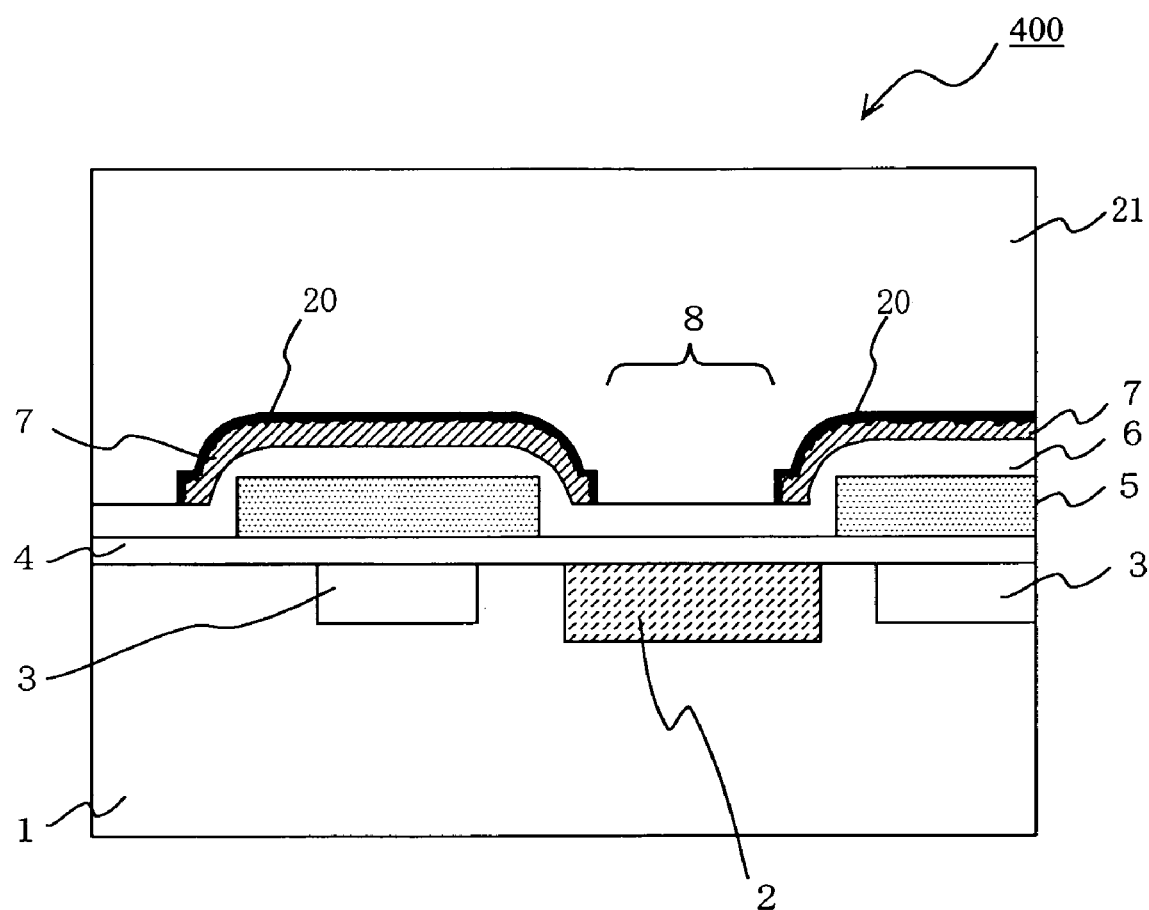
FIG. 4 is a cross-sectional view showing a structure of a conventional solid state imaging device.
Figure 5A:
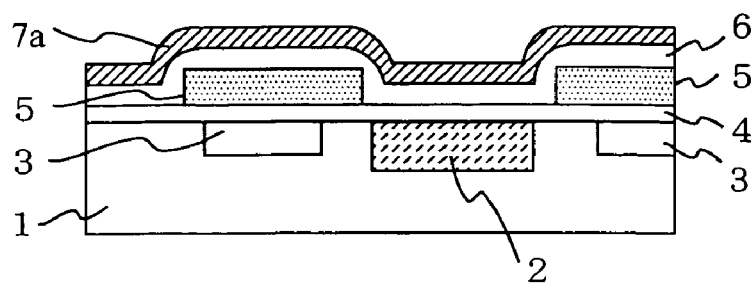
FIGS. 5A through 5E are cross-sectional views showing the steps of production of the solid state imaging device shown in FIG. 4.
Figure 5B:
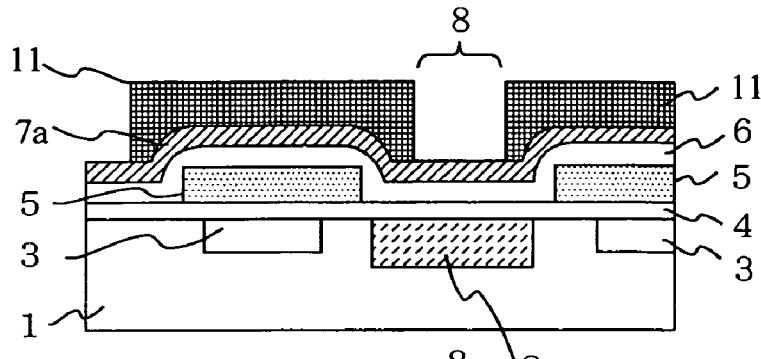
Figure 5C:
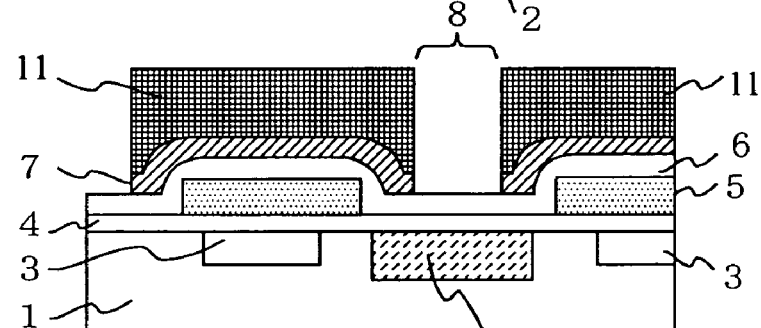
Figure 5D:
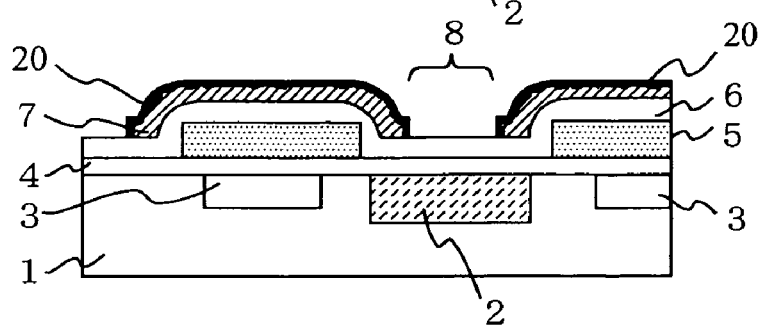
Figure 5E:
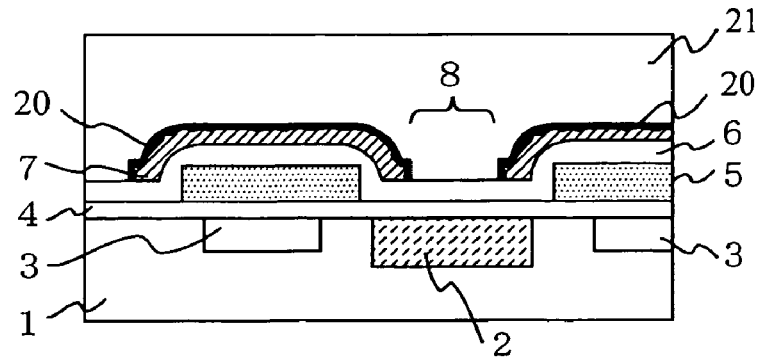

FIG. 3E is a cross-sectional view showing a state where the smoothing layer 10 is formed on the anti-oxidation layer 9. In this embodiment, the smoothing layer 10 is also formed by CVD in the chamber in which the anti-oxidation layer 9 is formed in the step shown in FIG. 3D. In other words, the anti-oxidation layer 9 and the smoothing layer 10 are formed in the same step. Specifically, the light shielding film 7 is exposed to the reactive gas atmosphere for about 200 seconds in the step shown in FIG. 3D, thereby depositing an NSG (Non-Doped Silicate Glass, which is silane-based silicon oxide) film having a thickness of 100 nm. Namely, by performing CVD using a mixture gas of $SiH_4$ gas and $N_2O$ gas as described above, $SiH_4$ gas is first reacted with the light shielding film 7 to form the anti-oxidation layer 9 and then the NSG film is formed, in one procedure automatically.

Although the anti-oxidation layer 9 covers the entire surface of the semiconductor substrate body including the light shielding film 7, the light collecting ratio at the light receiving section (photodiode 2) is not reduced owing to the light transmissive material forming the anti-oxidation layer 9. Since the surface of the light shielding film 7 is covered with the anti-oxidation layer 9, the sensitivity non-uniformity of the solid state imaging device is alleviated as in Embodiment 2. Furthermore, since the anti-oxidation layer 9 and the smoothing layer 10 are formed in the same step, the production efficiency can be improved.

In the above description, the smoothing layer 10 is formed of the NSG layer. The present invention is not limited to such a structure, and BPSG (Boron Phosphorous Silicate Glass) or the like is usable for the smoothing layer 10.

In the above embodiments, the light shielding film 7, the anti-oxidation layer 9, and the smoothing layer 10 are formed under exemplary conditions. The film or layer formation conditions are not limited to those described above. The structure of the solid state imaging device according to the present invention except for the anti-oxidation layer 9 is not limited to the structure shown in FIG. 1.

In the above embodiments, the smoothing layer 10 may contain impurities such as fluorine, boron, and phosphorus. Where such impurities are contained, the smoothness of the smoothing layer 10 is further improved.

In the above embodiments, a CCD is described as an example of the solid state imaging device. The present invention is also applicable to a MOS solid state imaging device.

A solid state imaging device and a method for producing the same according to the present invention have features that (i) high image characteristics are provided as a result of the scattering of the incident light at the surface of the light shielding film being suppressed and thus the sensitivity non-uniformity being suppressed, and (ii) the thickness of the light shielding film can be reduced and this can effectively reduce the size of the device. For these features, the present invention is preferably applicable to CCDs, CMOS sensors and the like. Specifically, the present invention is applicable to, for example, solid state imaging devices used in camera-equipped cellular phones, video cameras and digital still cameras, and line sensors used in printers.

While the invention has been described in detail, the foregoing description is in all aspects illustrative and not restrictive. It is understood that numerous other modifications and variations can be devised without departing from the scope of the invention.

What is claimed is:

1. A solid state imaging device for outputting an electric signal in accordance with an amount of light incident on a light receiving section thereof, the solid state imaging device comprising:

the light receiving section formed in a main surface portion of a semiconductor substrate;

a metal film having formed above the light receiving section an opening through which a light incident on the solid state imaging device is applied to the light receiving section from above the solid state imaging device; and an anti-oxidation layer partially covering the metal film, wherein;

the metal film has a surface forming a portion of the opening, and said surface is exposed from the anti-oxidation layer, the anti-oxidation layer is a silicide film, and the solid state imaging device is one of a CCD sensor and a CMOS sensor.

2. A solid state imaging device according to claim 1, wherein:

the metal film is a tungsten film; and the anti-oxidation layer is a tungsten silicide film.

3. A solid state imaging device according to claim 1, wherein the anti-oxidation layer is the silicide film having a thickness which is substantially 10 nm.

4. A solid state imaging device according to claim 1, wherein the metal film is a film selected from the group consisting of a high melting point metal film, a high melting point metal compound film, a laminate film formed by laminating the high melting point metal film to the high melting point metal compound film, a high melting point metal film containing a low melting point metal film, a high melting point metal compound film containing a low melting point metal film, and a laminate film formed by laminating a high melting point metal film, a high melting point metal compound film, and a low melting point metal film to each other.

5. A solid state imaging device according to claim 1, wherein the metal film is a tungsten film, and the tungsten film is a film selected from the group consisting of a tungsten sputtered film formed by sputtering, a tungsten CVD film formed by CVD, and a laminate film formed by laminating the tungsten sputtered film to the tungsten CVD film.

* * * * *